(12) United States Patent
Chen et al.

(10) Patent No.: US 6,972,461 B1
(45) Date of Patent: Dec. 6, 2005

(54) CHANNEL MOSFET WITH STRAINED SILICON CHANNEL ON STRAINED SIGE

(75) Inventors: Xiangdong Chen, Poughquag, NY (US); Dureseti Chidambarrao, Weston, CT (US); Geng Wang, Stormville, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,274

(22) Filed: Jun. 30, 2004

(51) Int. Cl.[7] ............................................. H01L 27/01
(52) U.S. Cl. ..................... 257/347; 257/353; 257/401; 257/619; 257/623; 257/192; 257/194; 257/195; 438/282; 438/172; 438/275; 438/933; 438/479; 438/486; 438/766
(58) Field of Search ................................. 257/347, 289, 257/411, 346, 349, 287, 288, 409, 412, 345, 257/344, 350, 353, 401, 619, 623, 190, 192, 257/194, 195, 616; 438/200, 201, 202, 205, 438/207, 486, 479, 766, 404, 282, 172, 275

(56) References Cited

U.S. PATENT DOCUMENTS

| | | | |
|---|---|---|---|
| 2004/0108559 A1 * | 6/2004 | Sugii et al. | 257/411 |
| 2004/0256647 A1 * | 12/2004 | Lee et al. | 257/289 |
| 2005/0003599 A1 * | 1/2005 | Yeo et al. | 438/200 |

* cited by examiner

Primary Examiner—Nathan J. Flynn
Assistant Examiner—Fazli Erdem
(74) Attorney, Agent, or Firm—Eric W. Petraske

(57) ABSTRACT

A structure for use as a MOSFET employs an SOI wafer with a SiGe island resting on the SOI layer and extending between two blocks that serve as source and drain; epitaxially grown Si on the vertical surfaces of the SiGe forms the transistor channel. The lattice structure of the SiGe is arranged such that the epitaxial Si has little or no strain in the direction between the S and D and a significant strain perpendicular to that direction.

16 Claims, 3 Drawing Sheets

CHANNEL MOSFET WITH STRAINED SILICON CHANNEL ON STRAINED SIGE

BACKGROUND OF INVENTION

The field of the invention is CMOS integrated circuit processing, in particular transistors with strained semiconductor in the channel.

In contemporary CMOS technology, there is significant interest and work in the use of strained material for the field effect transistor (FET) channel.

In one approach silicon-germanium alloy (SiGe), is used to form a surface channel strained Si/relaxed SiGe NMOSFET, biaxial tensile strain is induced in a very thin epitaxial Si layer. The tensile strain induces conduction band splitting, which results in re-population of the energy bands that enhances the electron mobility.

In the case of a PMOSFET, the Ge concentration must be greater than about 30% in order to have an effective increase in hole mobility.

This approach has the following defects:
1) The strained silicon is grown on relaxed SiGe, and therefore it is difficult to control the defect density.
2) The requirement for enhanced performance of more than 30% Ge concentration further increases the defect density.
3) The high diffusion speed in SiGe means that a very low temperature source/drain anneal is required in order to achieve a shallow junction.

SUMMARY OF INVENTION

The invention relates to a structure for a field effect transistor that employs a strained silicon channel formed on a base of compressively strained SiGe.

A feature of the invention is that the same structure is used for both n-type FETs (NMOS) and p-type FETs (PMOS) structures.

A feature of the invention is that there is no strain in the channel material along the direction of travel of the carriers.

Another feature of the invention is that there is significant tensile strain in at least one direction perpendicular to the direction of carrier travel, thereby increasing carrier mobility.

DETAILED DESCRIPTION

Figure 1:
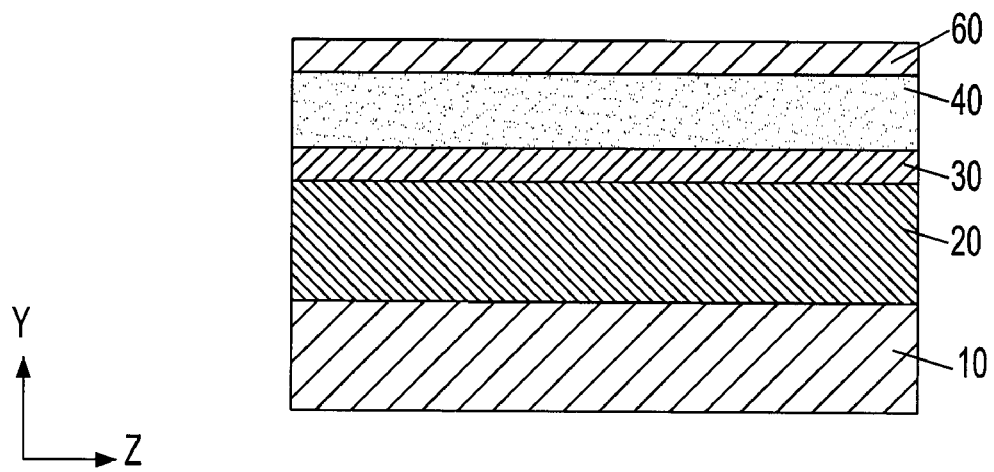
FIG. 1 shows a cross section of a wafer after preliminary steps.

FIG. 1 shows a cross section of a silicon SOI wafer with substrate 10, buried (oxide) insulator 20 (referred to as BOX) and silicon on insulator (SOI) layer 30, also referred to as a device layer. In this Figure, the y direction is vertical, the z direction extends to the left and right and the x direction extends into and out of the plane of the paper. An epitaxial layer of SiGe 40 has been grown in contact with layer 30 and a silicon dioxide (oxide-SiO2) hardmask 60 has been deposited or grown on layer 40.

The lattice constant of layer 30 is the standard for (100) oriented silicon wafers, with lattice constant a=5.43 Angstroms in the x,y,z direction. The epitaxial SiGe 40 has lattice constant a in the x direction, since it matches the value of layer 30. The SiGe has lattice constant b (b>a) in the y direction since SiGe naturally has a larger lattice constant than silicon. The layer also has lattice constant a in the z direction, since that value is also determined by the epitaxial growth process.

Figure 3:
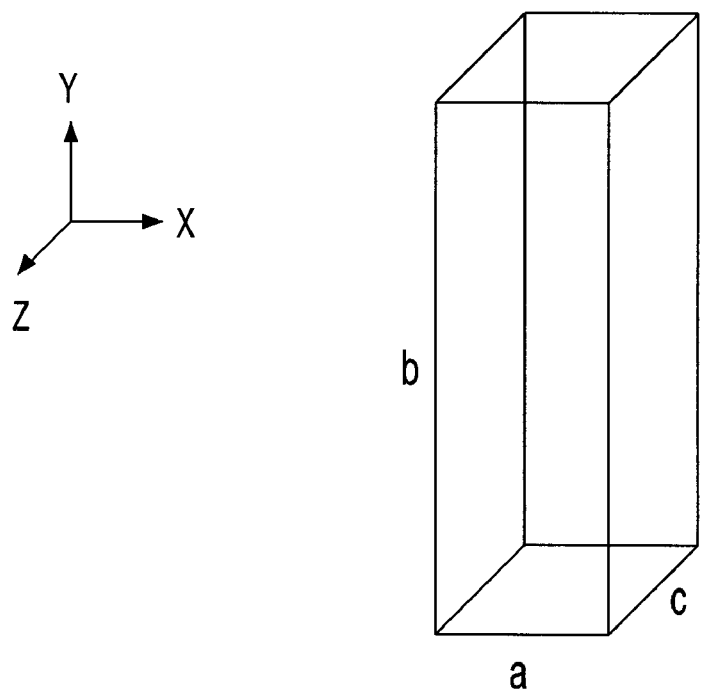
FIG. 3 shows the orientation of the crystal lattice.

The SiGe crystal structure serves to define the lattice constants for the silicon channel layers that will be put down later. In particular, as is indicated in FIG. 3, the vertical channel layers 50 have a lattice constant with the value a along the x direction, the direction of travel of the carriers, that is determined indirectly by SOI layer 30. Layer 30 determines through the epitaxial process the value of the SiGe lattice in the x and z direction. The SiGe lattice, in turn, determines the value of the lattice constant of the channel layer in the x and y direction. The SiGe layer is free to assume the value b in the y direction, since the SOI layer does not control the lattice constant in the direction perpendicular to the plane of the SOI layer.

Those skilled in the art are aware that the last lattice constant, c, is determined by the previous ones according to the following equation:

$$a*a*a=a*b*c \tag{1}$$

On the left side of equation (1) the three lattice constants of silicon determine a value ($a^3$) that controls the remaining lattice constant c.

The SiGe layer 40 is patterned using any convenient hardmask to define islands that will become the support for field effect transistors. A directional etch such as a reactive ion etch (RIE) etches through the layers 40 and 30, stopping on BOX 20.

Figure 2A:
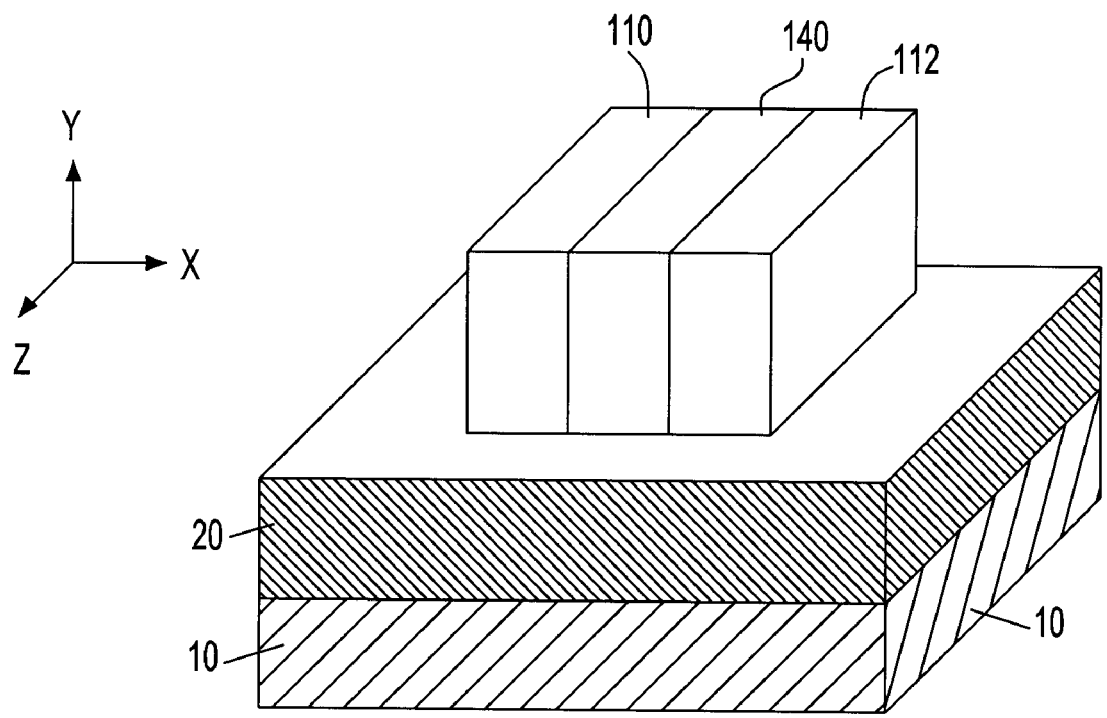
FIG. 2A shows a perspective view of a transistor according to the inveniton.

FIG. 2A shows a transistor formed according to the invention. The layers shown in FIG. 2A are the outermost layers of the transistor structure. The portion of Si layer 30 beneath the SiGe island is covered by the polycrystalline silicon (poly) gate and by the source and drain in this view. At the center, the transistor gate 140 covers the silicon channel layers that will be shown in other Figures. Source 110 on the left and drain 112 on the right bracket the gate area of the transistor.

Figure 2B:
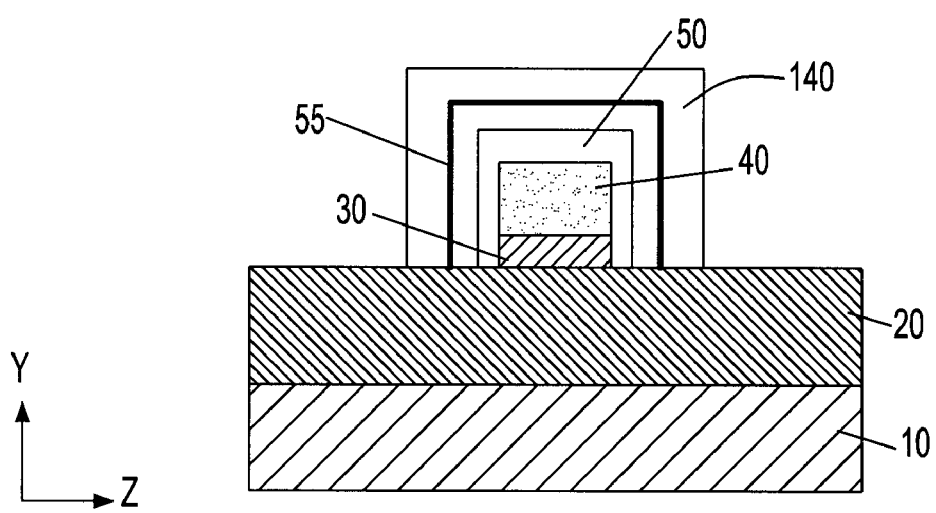
FIG. 2B shows a cross section of the transistor of FIG. 2A.

FIG. 2B shows a cross section through the island after completion of the structure. Substrate 10 and BOX 20 remain as before. SiGe layer 40 has been patterned as described above. SOI layer 30 has been patterned in the same step that defined the islands to form a bottom layer that defines crystal structure, but does not participate in the transistor operation. After the patterning of the islands, the oxide hardmask 60 is stripped. Strained silicon 50 is then grown epitaxially on the top surface and on both sides of the SiGe support. Gate oxide 55 is grown on the outer surfaces of the silicon 50 and polysilicon gate layer 140 is deposited over the oxide to form a transistor with carriers traveling perpendicular to the plane of the paper in all three layers 50.

The U-shaped silicon channel layer 50 is in contact with the SiGe, so that it has lattice constant b in the y direction and lattice constant a in the x direction. Layer 50 on the sides has lattice constant c in the z direction The value of b determines c according to equation (1). The top of layer 50 is a nonstrained Si layer with lattice constant a in every direction.

Since the lattice constant of the channel layers 50 in the x direction is the same as the un-strained value, there will be no strain in the x direction. There will be tensile strain in the y direction in the channel layers because they are grown in contact with the SiGe layer, which has lattice constant b (greater than the value characteristic of silicon) in the y direction. When completed, the current will flow through strained silicon layers parallel to the x-y plane. As is known in the art, transverse strain increases the mobility of both electrons and holes. Thus, both n-type and p-type FETs have increased mobility according to the invention.

The top of layer 50 also carries some current. There is no strain in this layer, and therefore, there is no drive current enhancement in this layer. The transverse distance (left-right distance in FIG. 2B) of this top silicon layer can be made very narrow, so that the drive current in this portion of layer 50 is only a small part of the total current.

At any convenient time, appropriate conventional masks will be deposited and patterned to isolate the transistor body from the source and drain and to define with implants the transistor channel as n-type or p-type. Also at any convenient time, the source and drain may be implanted, silicided or otherwise treated. Those skilled in the art will appreciate that it is an advantageous feature of the invention that tensile strain in the y direction enhances carrier mobility for both pfets and for NFETS.

The steps involved in masking and implanting the channels for n-FETs and p-FETs and in preparing the source and drain are conventional and well known to those skilled in the art.

The transverse distance along the z axis between the two channel layers 50 is not critical and may be chosen for convenience. Preferably, the width of the SiGe island is set as the minimum linewidth for that technology in order to produce a compact layout without excessive processing steps. If a compact layout is more important than processing steps, the following alternative embodiment may be used.

As an alternative version of the invention, transistors can be formed using techniques developed for manufacturing FINFETs.

Figure 4:
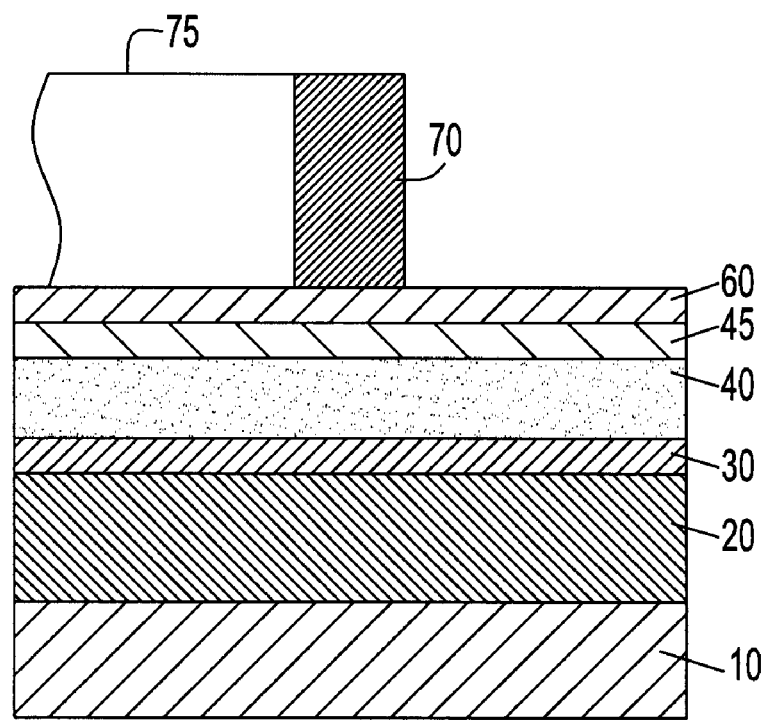
FIG. 4 shows an initial stage in forming an alternative embodiment.

FIG. 4 shows an initial structure for this alternative version, with a silicon substrate 10 having a buried insulator layer 20 and a silicon device layer (or SOI layer) 30. This base structure is illustratively a commercially available SIMOX wafer.

The SOI layer 30 may be illustratively thinned to a thickness of 10–20 nm by any convenient method.

Above silicon layer 30, a layer of SiGe 40 has been epitaxially grown, illustratively to a thickness of 50–1000 nm. The thickness of the SiGe layer will be dependent on the Ge concentration and such that the SiGe is not relaxed. A temporary silicon layer 45 (5–10 nm) is grown on top of the SiGe layer and an oxide hardmask 60 is grown on the temporary silicon 45.

The SiGe lattice constant in the direction to the left and right in FIG. 4 (referred to as the z direction) is "a", the same as the value of the device layer, since layer 40 is epitaxial. The SiGe lattice constant in the vertical direction in FIG. 4, (referred to as the y direction) is "b", which is greater than a. After definition of a thin SiGe fin, a silicon channel layer 130 will grown on the top and sides of the SiGe fin 40 that will be the channel of the transistor.

In this example, conventional techniques used in FINFET fabrication to define the fin may be used to define the SiGE fin. For example, FIG. 4 shows a temporary poly structure 75 with a nitride sidewall 70 having the fin width is formed; the poly structure is removed and the nitride sidewall 70 is used as a fin hardmask to define the oxide hardmask used in patterning the SiGe stack. In current technology, a width of mask 70 of less than 70 nm is readily achievable. With present technology, it is preferable that the fin have a width of less than 50 nm for strength. In the future, thinner fins are expected to be used. The actual value will depend on spacing requirements. The silicon and Si—SiGe—Si stack is etched directionally, e.g. a reactive ion etch, stopping on BOX 20.

Figure 5:
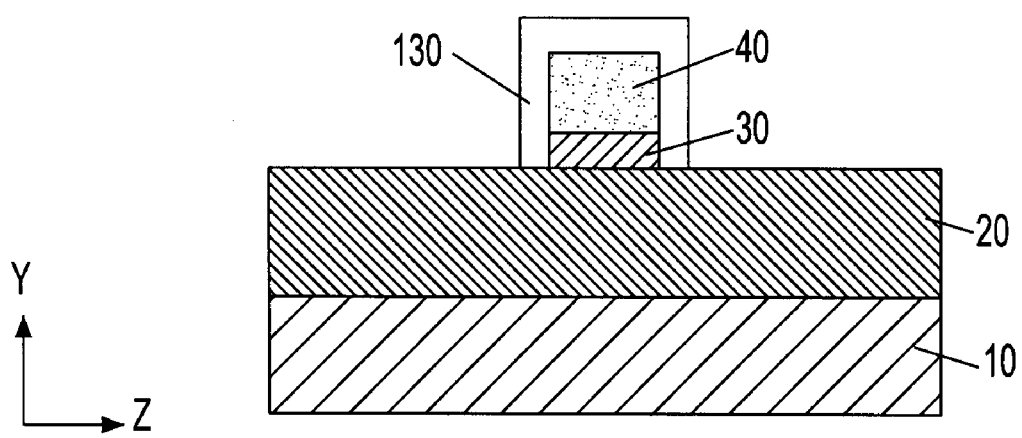
FIG. 5 shows a cross section of the alternative embodiment

After the SiGE fin stack is defined, the oxide hardmask and silicon top layer 45 are removed before the Si channel growth. A Si layer 130 will be grown epitaxially on SiGe 40 that will contain the transistor channel, as shown in FIG. 5. The thickness of the silicon may be 10 nm. The sidewall Si layer has strain in the y direction (lattice constants a,b,c defined as before). The top Si cap does not have the advantage of a correct strain, but it is kept because it is very difficult to grow gate oxide directly on SiGe.

The SiGe is grown epitaxially such that the lattice constant in the vertical direction (perpendicular to the plane of the wafer surface) has a value (b) that is the same as the value of the SiGe layer 40 and greater than the lattice constant (a) of SOI layer 30 As with the previous embodiment, the lattice constant of layer 130 in the x direction will be set by equation (1).

At the bottom, layers 130 are in contact with layer 30 and also have the silicon crystal structure, so that the lattice constant in the left-right direction at the bottom tends to be a, the same as the value of layer 30. Only a small bottom part of layer 130 touches layer 30, so that there is only a small strain that does not significantly affect the transistor performance. Since this structure is meant to be used with thin SOI layers 30, the vertical extent of the affected portion of layers 130 will be small.

As a result, the lattice structure for silicon 130 is shown in FIG. 3, in which lattice constant "b" is in the direction perpendicular to the wafer, the direction parallel to the path of the carriers (perpendicular to the plane of the paper in FIG. 5) is "a", the value of the SOI layer 30, and the lattice constant in the direction to the left and right in FIG. 5 is "c", with b>a>c.

As with the previous embodiment, a gate oxide is grown on the outer surface of layer 130 and a poly gate is deposited overall. Conventional steps form source and drain areas in electrical contact with the transistor channel. The remainder of the process may be as illustrated in "A Functional FinFET—DG CMOS SRAM cell", IEDM 2002.

Those skilled in the art will appreciate that variations may be made in the examples shown. For example, the wafer may be bulk, if that is compatible electrically with the requirements of the transistors, in which case, the term device layer will refer to the top layer of the wafer. Additionally, various materials may be substituted for the examples given and various techniques of forming the support structures may be used. The support structures need not be SiGe. Those skilled in the art will be aware that other materials having appropriate lattice constants and having the ability to be epitaxially deposited may be used.

While the invention has been described in terms of a single preferred embodiment, those skilled in the art will recognize that the invention can be practiced in various versions within the spirit and scope of the following claims.

What is claimed is:

1. A method of forming a field effect transistor comprising the steps of:

providing a semiconductor wafer of a silicon having a device layer with a device layer lattice constant;

forming an epitaxial layer of a second semiconductor material on said device layer of said semiconductor wafer, said second material having a second lattice constant greater than said device lattice constant in a direction perpendicular to said wafer and said device layer lattice constant in a channel direction parallel to said wafer;

patterning said epitaxial layer of said second material to form at least one vertical side in said channel direction;

growing an epitaxial semiconductor channel layer of silicon on said vertical side, said channel layer having said second lattice constant perpendicular to said wafer and said device lattice constant along said channel direction, whereby said channel layer has tensile strain perpendicular to said channel direction and to said wafer;

forming a gate insulator in a body area of at least one vertical side of said channel;

forming a gate electrode abutting said gate insulator; and forming source and drain electrodes in contact with opposite ends of said body area.

2. A method according to claim 1, in which said second semiconductor material is SiGe.

3. A method according to claim 1, in which said step of patterning said epitaxial layer comprises forming an island having two vertical sides separated by a transverse distance;
said step of forming said channel layer forms said channel layer on said two vertical sides;
said step of forming said gate insulator forms said gate insulator on body areas of both said vertical sides; and
said step of forming said gate electrode forms said gate electrode on said two vertical sides.

4. A method according to claim 2, in which said step of patterning said epitaxial layer comprises forming an island having two vertical sides;
said step of forming said channel layer forms said channel layer on said two vertical sides;
said step of forming said gate insulator forms said gate insulator on body areas of both said vertical sides; and
said step of forming said gate electrode forms said gate electrode on said two vertical sides separated by a transverse distance.

5. A method according to claim 1, in which said step of patterning said epitaxial layer comprises forming an island having two vertical sides separated by a transverse distance;
said step of forming said channel layer forms said channel layer on said two vertical sides and on a top surface of said island, whereby said channel layer on said top surface has said device lattice constant along said transverse distance and along said channel direction;
said step of forming said gate insulator forms said gate insulator on body areas of both said vertical sides and on said top surface; and
said step of forming said gate electrode forms said gate electrode on said two vertical sides and said top surface.

6. A method according to claim 2, in which said step of patterning said epitaxial layer comprises forming an island having two vertical sides separated by a transverse distance;
said step of forming said channel layer forms said channel layer on said two vertical sides and on a top surface of said island, whereby said channel layer on said top surface has said device lattice constant along said transverse distance and along said channel direction;
said step of forming said gate insulator forms said gate insulator on body areas of both said vertical sides and on said top surface; and
said step of forming said gate electrode forms said gate electrode on said two vertical sides and said top surface.

7. A method according to claim 1, further comprising a step of implanting said body area of said channel layer p-type, whereby said MOS transistor is an nfet.

8. A method according to claim 1, further comprising a step of implanting said body area of said channel layer n-type, whereby said MOS transistor is a pfet.

9. A method of forming a MOS transistor comprising the steps of:
providing a semiconductor wafer of silicon having a device layer with a device layer lattice constant;
forming an epitaxial layer of a second semiconductor material on said device layer of said semiconductor wafer, said second material having a second lattice constant greater than said device lattice constant in a direction perpendicular to said wafer and said device layer lattice constant in a channel direction parallel to said wafer;
forming a fin hardmask in a transistor area of said wafer;
patterning said epitaxial layer of said second material to form a fin of said second semiconductor material having at least one vertical side in said channel direction between source and drain areas;
growing an epitaxial semiconductor channel layer of silicon on said vertical side, said channel layer having said second lattice constant perpendicular to said wafer and said device lattice constant along said channel direction, whereby said channel layer has tensile strain perpendicular to said channel direction and to said wafer;
forming a gate insulator in a body area of at least one vertical side of said channel layer;
forming a gate electrode abutting said gate insulator; and
forming source and drain electrodes in said source and drain areas and in contact with opposite ends of said body area.

10. A method according to claim 9, in which said second semiconductor material is SiGe.

11. A method according to claim 9, in which said step of patterning said epitaxial layer comprises forming a fin having two vertical sides separated by a transverse distance;
said step of forming said channel layer forms said channel layer on said two vertical sides;
said step of forming said gate insulator forms said gate insulator on body areas of both said vertical sides; and
said step of forming said gate electrode forms said gate electrode on said two vertical sides.

12. A method according to claim 10, in which said step of patterning said epitaxial layer comprises forming a fin having two vertical sides;
said step of forming said channel layer forms said channel layer on said two vertical sides;
said step of forming said gate insulator forms said gate insulator on body areas of both said vertical sides; and
said step of forming said gate electrode forms said gate electrode on said two vertical sides separated by a transverse distance.

13. A method according to claim 9, in which said step of patterning said epitaxial layer comprises forming a fin having two vertical sides separated by a transverse distance;
said step of forming said channel layer forms said channel layer on said two vertical sides and on a top surface of said fin, whereby said channel layer on said top surface has said device lattice constant along said transverse distance and along said channel direction;

said step of forming said gate insulator forms said gate insulator on body areas of both said vertical sides and on said top surface; and said step of forming said gate electrode forms said gate electrode on said two vertical sides and said top surface.

14. A method according to claim 10, in which said step of patterning said epitaxial layer comprises forming a fin having two vertical sides separated by a transverse distance;

said step of forming said channel layer forms said channel layer on said two vertical sides and on a top surface of said fin, whereby said channel layer on said top surface has said device lattice constant along said transverse distance and along said channel direction;

said step of forming said gate insulator forms said gate insulator on body areas of both said vertical sides and on said top surface; and said step of forming said gate electrode forms said gate electrode on said two vertical sides and said top surface.

15. A method according to claim 9, further comprising a step of implanting said body area of said channel layer p-type, whereby said MOS transistor is an nfet.

16. A method according to claim 9, further comprising a step of implanting said body area of said channel layer n-type, whereby said MOS transistor is a pfet.

* * * * *